United States Patent [19]

Tohyama

[11] Patent Number: 4,875,084
[45] Date of Patent: Oct. 17, 1989

[54] OPTOELECTRIC TRANSDUCER
[75] Inventor: Shigeru Tohyama, Tokyo, Japan
[73] Assignee: NEC Corporation, Tokyo, Japan
[21] Appl. No.: 174,464
[22] Filed: Mar. 28, 1988
[30] Foreign Application Priority Data
 Mar. 26, 1987 [JP] Japan ................................ 52-73240
[51] Int. Cl.$^4$ ...................... H01L 27/14; H01L 31/06
[52] U.S. Cl. ........................................ 357/30; 357/33;
                 357/15; 357/89; 357/7; 357/58; 357/24
[58] Field of Search ..................... 357/30, 33, 15, 89,
                                                   357/7, 58, 24

[56] References Cited
U.S. PATENT DOCUMENTS

| | | | |
|---|---|---|---|
| 3,398,334 | 8/1968 | Schockley | 357/33 |
| 4,410,902 | 10/1983 | Malik | 357/4 |
| 4,586,074 | 4/1986 | Stapelbroek et al. | 357/58 |
| 4,638,345 | 1/1987 | Elabd et al. | 357/15 |

FOREIGN PATENT DOCUMENTS

| | | | |
|---|---|---|---|
| 61-241985 | 10/1986 | Japan | 357/30 |
| 2144909 | 3/1985 | United Kingdom | 357/30 |
| 8700693 | 1/1987 | World Int. Prop. O. | 357/30 |

Primary Examiner—Andrew J. James
Assistant Examiner—Jerome Jackson
Attorney, Agent, or Firm—Sughrue, Mion, Zinn, Macpeak & Seas

[57] ABSTRACT

For precise selection of a cut-off wavelength of an incident light, there is disclosed an optoelectric transducer operative to produce an electric charges on the basis of an incident light, comprising, (a) a carrier injected region with a first conductivity type formed of a non-degenerative semiconductor material and having a surface capable of being illuminated by the incident light, (b) a potential-barrier region, a first homojunction being formed between the carrier injected region and the potential-barrier region, and (c) a photoelectric converting region with the first conductivity type formed of a degenerative semiconductor material, a second homojunction being formed between the potential-barrier region and the photoelectric converting region, wherein a potential barrier is formed at the second homojunction between the potential-barrier region and the photoelectric converting region, so that it is possible to form the potential-barrier with a arbitrary height by selecting the two semiconductor materials for the potential-barrier region and the photoelectric converting region.

18 Claims, 7 Drawing Sheets

PRIOR-ART

PRIOR-ART

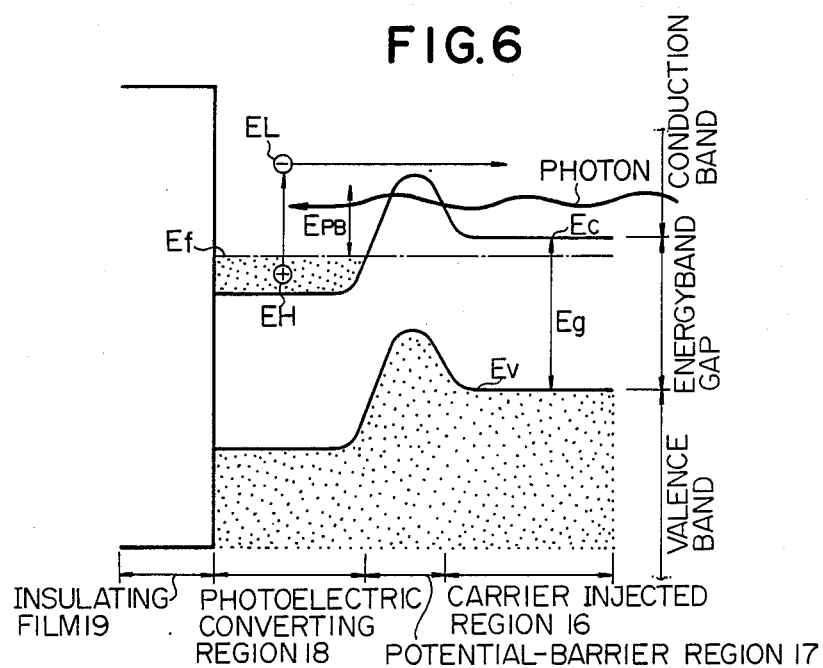
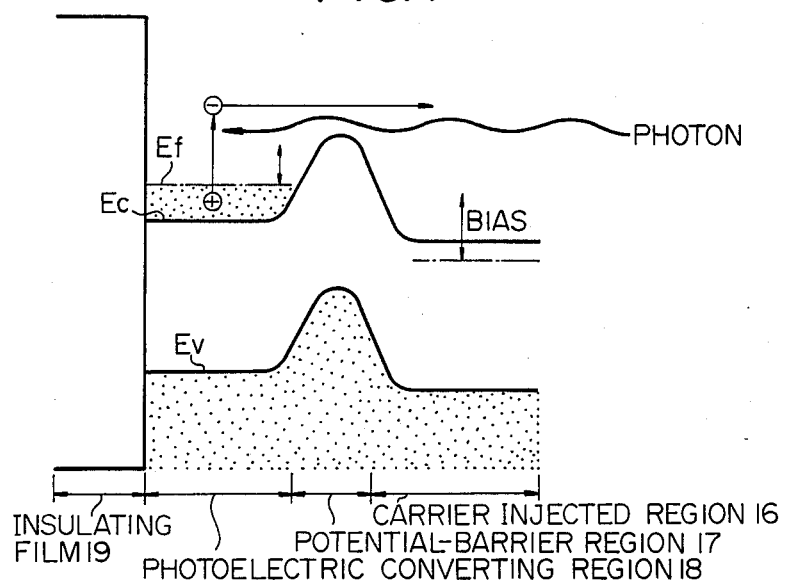

OPTOELECTRIC TRANSDUCER

FIELD OF THE INVENTION

This invention relates to an optoelectric transducer and, more particularly, to a photodetector capable of detection of rays in, for example, the infrared region.

BACKGROUND OF THE INVENTION

The theory of the infrared Schottky-barrier detector with optical cavity is described by Hammam Elabd and Walter F. Kosonocky in "Theory and Measurements of Photoresponse for Thin Film Pd$_2$Si and PtSi infrared Schottky-Barrier Detectors With Optical Cavity ", RCA Review Vol. 43, December 1982, pages 569 to 589. A typical example of the infrared Schottky-barrier detector with optical cavity is illustrated in FIG. 1 of the drawings. The infrared detector illustrated in FIG. 1 is of the back illuminated structure type with a Schottky contact between a metal and a p-type semiconductor material and comprises a p-type monocrystalline silicon substrate 1. The silicon substrate 1 has polished surfaces on both sides thereof, and one of the polished surfaces provides a light incident surface coated with an antireflection material 2. On the other polished surface is formed a platinous mono-silicide (PtSi) film 3 which serves as a photoelectric converting region with a Schottky-barrier formed at a boundary surface between the p-type silicon substrate 1 and the platinous silicide film 3, and the photoelectric converting region is surrounded by an n-type impurity region 4 serving as a guard ring for reduction in edge effect. The other polished surface is covered with a thermally grown silicon dioxide (SiO$_2$) layer 5 which defines the photoelectric converting region. On the entire surfaces of the silicon dioxide layer 5 and the thermally grown silicon dioxide layer 5 is deposited a dielectric layer 6 of silicon oxides (SiO, SiO$_2$ and so on) or, alternatively, of silicon nitrides (SiN, Si$_3$N$_4$ and so on) by using a chemical-vapor-deposition technique. For enhancement of optical absorption, a metallic mirror 7 is formed on the dielectric layer 6, then an optical resonance takes place in a multiple layer structure consisting of the p-type monocrystalline silicon substrate 1, the platinous silicide film 3, the dielectric layer 6 and the metallic mirror 7. The dielectric layer has a thickness optimized in such a manner that the platinous silicide film 3 is located at one of antinodes of a steady wave produced by an infrared ray with the major wavelength within a detectable range. An n-type heavily doped impurity region 9 is formed in the silicon substrate 1, and the heavily doped impurity region 9 is contact with the platinous silicide film 3 to form an ohmic contact therebetween. The heavily doped impurity region 9 in turn is contact with an aluminum wiring layer 10 in ohmic manner, so that electric charges produced by the photoelectric conversion are effectively extracted from the platinous monosilicide film 3 to the outside through the n-type heavily doped region 9 and the aluminum wiring layer 10. On the entire surface of the structure is deposited a passivation film 11 which prevents the multiple layer structure from physical and chemical damages. In this prior-art example, the silicon substrate 1 is of the p-conductivity type , but the silicon substrate 1 and the impurity regions 4 and 9 may be of the n-conductivity type and of the p-conductivity type, respectively, in a metal-n-type semiconductor Schottky-barrier implementation. Moreover, a front illuminated structure is formed without the anti-reflection material 2 and the metallic mirror 7, but the dielectric layer 6 serves as not only a passivation film but also an anti-reflection film.

The fabrication processes used for silicon integrated circuits can be adopted to form these prior-art infrared Schottky-barrier detectors, and it is relatively easy to form the photoelectric converting regions in array. Then, the structure illustrated in FIG. 1 is appropriate to a photo detecting array of a solid-type infrared image sensor. In the photo detecting array, electric charges produced by the photoelectric conversion are not directly supplied to an aluminum wiring layer corresponding to the aluminum wiring layer 10, but are read out to a charge-coupled-device or, alternatively, a MOS structure scan-and-reading-out unit.

As to the operating condition, the PtSi infrared Schottky-barrier detector illustrated in FIG. 1 is used in a temperature around a liquid nitrogen, because a large amount of dark current flows in an operation at a room temperature due to the relatively low Schottky-barrier height ranging between 0.20 eV and 0.25 eV which results in a large number of thermally excited carriers flowing across the low Schottky-barrier. Of course, the amount of the dark current is relationally increased or decreased depending upon the Schottky-barrier height, then the operating temperature may be lower if the Schottky-barrier is decreased in height but higher if the Schottky-barrier is increased in height.

Subsequently, description is hereinunder made for the photoelectric conversion phenomenon with reference to FIGS. 2 and 3. FIG. 2 shows an energyband diagram showing a Schottky-barrier formed at a boundary surface between a metal layer and a p-type semiconductor material, and, on the other hand, FIG. 3 shows an energyband diagram showing a Schottky-barrier formed at a boundary surface between a metal and an n-type semiconductor material. Both of the energyband diagrams are applicable to the back illuminated structures, respectively, however incident rays are illuminated upon front sides opposite to the back sides, respectively, if the detectors are of the front illuminated type. Upon illumination of the rays, the photons having energies sufficient to excess the energyband gap Eg of the semiconductor material are liable to be absorbed in a region of the semiconductor material located in the vicinity of the incident surface. However, if the photons have lower energy levels as those of the infrared rays, there is negligible probability of absorption of energy which results in transition of electrons from the valence band to the conduction band, so that the photons pass through the semiconductor material and reach the metal region without substantial loss. In the metal region, all of the energy levels under the Fermi level Ef are occupied by electrons, however when the photons of the infrared rays reach the metal, some of the electrons in the valence band are exited with the photon energies hv ( where h is Planck's constant and v is the light frequency ), so that the exited electrons transit to the conduction band as hot electrons EL, leaving hot holes HL in the valence band. These hot electrons EL and hot holes HL travel in the metal region until recombination, and the movements thereof isotropically take place. Then, some hot holes HL reach the boundary surface between the metal region and the p-type semiconductor material in the structure having the energyband shown in FIG. 2, and the hot holes HL with component energies sufficient to exceed the Schottky-barrier $E_{SB}$ are injected from the metal region into the p-type semiconductor material. In other words, a hot hole can be injected from the metal through the Schottky barrier to the p-type semiconductor material if the hot hole has an energy larger than the Schottky barrier height and the component quantity of motion perpendicular to the boundary surface between the metal and the p-type semiconductor material the converted energy of which is larger than the Schottky barrier height. Thus, the injected hot holes and the leaving hot electrons participate in electric currents capable of forming electric signals. The energy of the hot hole is measured with respect to the Fermi level Ef and has positive values in the lower region under the Fermi level in FIGS. 2 and 3.

On the other hand, in the structure with the energy band shown in FIG. 3, some hot electrons similarly reach the boundary surface between the metal region and the n-type semiconductor material, and the hot electrons with component energies sufficient to exceed the Schottky-barrier $E_{SB}$ are injected from the metal to the n-type semiconductor material, leaving the hot holes in the metal. In other words, a hot electron can be injected from the metal through the Schottky barrier to the n-type semiconductor material if the hot electron has an energy larger than the Schottky barrier height and the component quantity of motion perpendicular to the boundary surface between the metal and the n-type semiconductor material the converted energy of which is larger than the Schottky barrier height. These injected hot electrons and the hot holes participate in electric currents representative of electric signals as in the similar manner to that shown in FIG. 2. The energy of the hot electron is also measured with respect to the Fermi level Ef, but the positive area extends in the opposite direction to that of FIG. 2.

In the case where the structure is of the front illuminated type or has a thin semiconductor layer with transparency to the incident rays, the uppermost energy level of available rays is larger than the energy bandgap Eg, so that free electrons and holes produced in the semiconductor material by the photoexciting also participate in the electric currents representative of the electric signal.

Further, if the thickness of the metal is smaller than the traveling distance of each hot hole in the (case of FIG. 2) during the lifetime or the traveling distance of each hot electron (in the case of FIG. 3) during the lifetime, some hot holes or some hot electrons move toward the dielectric material and are reflected on the boundary surface between the metal region and the dielectric material, then traveling in the opposite direction toward the boundary surface between the metal and the semiconductor. If the hot holes or the hot electrons have energy levels sufficient to exceed the Schottky-barrier, these hot holes or the hot electrons are injected into the semiconductor material and participate in the electric currents. On the other hand, the hot holes and the hot electrons with insufficient energy levels are reflected on the boundary surface between the metal and the semiconductor material and repeat the reflection between the two boundary surfaces, however an incidence of angle is gradually varied during the reflection between the two boundary surfaces and, finally, allows some of the hot holes or the hot electrons to have the energy components each sufficient to exceed the Schottky-barrier. In detail, it is necessary for a hot hole or an hot electron capable of being injected into the semiconductor material during reflections between the boundary of the metal and the semiconductor material and the boundary of the metal and the insulating material to have an energy larger than the Schottky barrier height. Although the hot hole or the hot electron has an energy larger than the Schottky barrier height, the component of quantity of motion perpendicular to the boundary of the metal and semiconductor material is insufficient to exceed the Schottky barrier in terms of converted energy. However, the hot hole or the hot electron may have a sufficient converted energy to exceed the Schottky barrier height during repetition of the reflection due to variance of the incident angle. If so, the hot hole or the hot electron can be injected into the semiconductor material. In this situation, each hot hole or each hot electron is injected into the semiconductor material and participates the electric currents. These phenomena are conducive to improvement in injection efficiency of hot hole (in the case of FIG. 2) or of hot electron (in the case of FIG. 3). In general, the thinner the metal is used, the higher in the injection efficiency the detector gets. However, if the metal is decreased in thickness over a certain value, the absorption of the infrared rays deteriorates, so that the metal should be optimized in view of quantum efficiency. For this reason, the Schottky-barrier infrared detector usually has a metal layer with the optimum value.

However, problems are encountered in the prior-art Schottky-barrier infrared detector as follows.

First, the metal film serving as the photoelectric converting region has a polycrystal structure, so that the metal film has a large number of scattering centers such as grain boundaries and lattice defects. If the semiconductor substrate is formed of single crystal silicon, an epitaxial silicide such as, for example, a platinous monosilicide (PtSi) is usually used instead of the metal film because of its orientation. However, lattice mismatches tend to take place between the silicon substrate and the silicide film grown by an epitaxial technique, and, for this reason, grain boundaries and lattice defects are liable to be produced so as to reduce the mechanical stress due to the lattice mismatches. This means that there is no difference between the metal film and the silicide film. In other words, the hot holes or the hot electrons are liable to be scattered due to not only thermal vibrations of the crystal lattice but also the grain boundaries and the lattice defects, so that the hot holes or the hot electrons respectively lose parts of energies thereof during the traveling in the metal region or silicide film. Then, a problem is encountered in the prior-art Schottky-barrier infrared detector in short lifetime of the hot hole or the hot electron produced therein which in turn results in deterioration in injection efficiency of the hot hole or the hot electron.

Second, a Schottky contact is a kind of heterojunction, so that the boundary surface is inferior in comparison with a homojunction. This results in deterioration in injection efficiency of the hot hole from the metal film to the p-type semiconductor material or in injection efficiency of the hot electron from the metal film to the n-type semiconductor material.

Third, when the Schottky-barrier infrared detector is of the back illuminated type, each available ray should have a photon energy hv in a range given by the following inequality (1)

$$E_{SB} < h\nu < E_g \qquad \text{(Inequality 1)}$$

where $E_{SB}$ is the Schottky-barrier height and Eg is energy bandgap of the semiconductor material. However, a metal has a large number of energy levels under the Fermi level occupied by electrons and, on the other hand, a large number of vacancy levels over the Fermi level, so that the photon energies are liable to be consumed with excitement of hot holes without sufficient energy levels to exceed the Schottky-barrier formed at the boundary surface between the metal and the p-type semiconductor material or with excitement of hot electrons without sufficient energy levels to exceed the Schottky-barrier formed at the boundary surface between the metal and the n-type semiconductor material. These undesirable phenomena take place upon absorption of the photon energy by an electron occupying an energy level Ee in the following range $$Ef - E_{SB} \leq Ee \leq Ef$$

where Ef is the Fermi level and $E_{SB}$ is the Schottky-barrier height between the metal and the p-type semiconductor material. If a Schottky barrier is formed between a metal and an n-type semiconductor material, the undesirable phenomena take place under an excitement of an electron occupying an energy level Ee' in the following range.

$$Ef - hv < Ee' \leq Ef - hv + E_{SB}$$

These undesirable phenomena are represented by the hot hole and the hot electron without arrows respectively extending toward the semiconductor materials in FIGS. 2 and 3.

It is sure that a few hot holes with insufficient energies or a few hot electrons with insufficient energies can be injected into the semiconductor material in virtue of the tunnel effect However, this injection efficiency is extremely small, so that a material amount the photon energies are consumed by the hot holes or the hot electrons with the energy levels in the above ranges without producing the electric currents representing the electric signal. This kind of photon energy loss becomes serious in a Schottky-barrier infrared detector of the back illuminated type having an optical cavity similar to that illustrated in FIG. 1.

Additionally, if a Schottky-barrier infrared detector has a semiconductor material with a wide energy bandgap, a wavelength of a detectable ray may occupy a position in the visible ray area as will be understood from the above mentioned inequality. Moreover, if a detector is of the front illuminated type or of the back illuminated type having an extremely narrow semiconductor layer allowing incident rays with energy levels larger than the energy bandgap of the semiconductor material to pass therethrough, the uppermost energy level of available rays may be larger in value than the energy bandgap Eg of the semiconductor material.

Fourth, it is difficult to form a Schottky-barrier with an arbitrary height because the Schottky-barrier height is almost determined by a combination of metal and semiconductor material. This means that a problem is encountered in determination of cutoff wavelength. It is well known in the art that a responsivity R of a Schottky-barrier infrared detector is given by the following equation $$R = C_1 (1 - E_{SB}/hv)^2$$
$$= C_1 (1 - (E_{SB} \times 1)/(h \times c))^2$$

where $C_1$ is a constant, 1 is the wavelength of a incident ray and c is the speed of light in vacuum. As will be clear from the above equation, the lower the Schottky-barrier it is formed, the longer cut-off wavelength it is selected. Then, the responsivity is increased in value. On the other hand, if a relatively low Schottky-barrier is formed, the hot holes or the hot electrons exceeding the Schottky-barrier are increased in number due to thermal excitement, thereby increasing the dark current as described hereinbefore. Then, it is necessary to use the Schottky-barrier infrared detector operative in a low temperature, and, for this reason, a problem is encountered in using a cooling unit. In other words, there is a trade-off between the cut-off wavelength and the operating temperature. This means that a cut-off wavelength should be selected in a reasonable low temperature for improvement, however a Schottky-barrier height strongly links with a combination of metal and semiconductor as described hereinbefore, so that adjustment of the Schottky-barrier height is impossible in so far as a suitable combination of metal and semiconductor material would be found by a designer.

SUMMARY OF THE INVENTION

It is therefore an important object of the present invention to provide an optoelectric transducer which is free from the problems inherent in the prior-art Schottky-barrier detector.

In accordance with one aspect of the present invention, there is provided an optoelectric transducer operative to produce electric charges on the basis of incident light, comprising: (a) a first region with a first conductivity type formed of a non-degenerative semiconductor material and having a surface capable of being illuminated by the incident light; (b) a second region, a first homojunction being formed between the first region and the second region; and (c) a third region with the first conductivity type formed of a degenerative semiconductor material, a second homojunction being formed between the second region and the third region, wherein a potential barrier is formed at the second homojunction between the second region and the third region.

In accordance with another aspect of the present invention, there is provided an optoelectric transducer operative to produce an electric charges on the basis of an incident light, comprising (a) a carrier injected region with a first conductivity type formed of a non-degenerative semiconductor material and having a surface capable of being illuminated by the incident light, (b) a potential-barrier region, a first homojunction being formed between the carrier injected region and the potential-barrier region, and (c) a photoelectric converting region with the first conductivity type formed of a degenerative semiconductor material, a second homojunction being formed between the potential-barrier region and the photoelectric converting region, wherein a potential barrier is formed at the second homojunction between the potential-barrier region and the photoelectric converting region. The potential barrier formed at the second homojunction may tend to block the majority carriers.

The potential-barrier region may formed of a non-degenerative semiconductor material of the first conductivity type smaller in impurity concentration than the carrier injected region or, alternatively, of an intrinsic semiconductor material.

In another implementation, the potential-barrier region is formed of a semiconductor material of a second conductivity type opposite to the first conductivity type, and the semiconductor material of the second conductivity type has an impurity concentration and a thickness selected in such a manner that the semiconductor material of the second conductivity type is depleted by two depletion layers extending from the first homojunction and the second homojunction, respectively, in an operating condition.

In order to perfectly deplete the potential-barrier region in the operating condition, the carrier injected region is formed of a p-type silicon material doped with p-type impurity atoms to have an impurity atom concentration of about $1 \times 10^{15}$ cm$^{-3}$, the potential-barrier region is formed of an n-type silicon material doped with n-type impurity atoms to have a peak impurity atom concentration ranging between $3 \times 10^{16}$ cm$^{-3}$ and $5 \times 10^{16}$ cm$^{-3}$, the n-type impurity atoms being distributed to have a profile tracing a half of a Gaussian distribution curve, the potential-barrier region has a thickness ranging between 200 nano-meters and 300 nano-meters, and the photoelectric converting region is formed of a p-type semiconductor material doped with p-type impurity atoms distributed to have a stepped profile with impurity atom concentrations from about $10^{18}$ cm$^{-3}$ to the uppermost solid solubility.

The optoelectric transducer may further comprise an insulating layer formed on the photoelectric region and a mirror of aluminum formed on the insulating layer for causing the carrier injected region, the potential-barrier region, the photoelectric converting region, the insulating layer and the mirror to form in combination an optical cavity for an optical resonance. In order to allow the optical resonance to take place in the optical cavity, if the photoelectric converting region has a p-type impurity atom concentration of about $10^{20}$ cm$^{-3}$ and a thickness ranging between 400 nano-meters and 500 nano-meters, the insulating layer may be formed by a silicon oxide film with a thickness ranging between 1.5 micron and 2.0 microns.

The optoelectric transducer may further comprise an antireflection film formed on the surface of the carrier injected region, and another optoelectric transducer may have a short circuit providing an electric path between the photoelectric converting region and the potential-barrier region for elimination of undesirable free carriers. For improvement of quantum effect, the optoelectric transducer may comprise multiple films having an upper potential-barrier region and an upper carrier injected region of the first conductivity type and provided between the photoelectric converting region and the insulating film.

The optoelectric detector is applicable to an infrared detector and a pixel of an image sensor.

BRIEF DESCRIPTION OF THE DRAWINGS

The features and advantages of an optoelectric transducer according to the present invention will be more clearly understood from the following description taken in conjunction with the accompanying drawings in which:

FIGS. 6 and 7 are energyband diagrams of another optoelectric transducer embodying the present invention in thermal equilibrium and in a biassed condition, respectively;

DESCRIPTION OF THE PREFERRED EMBODIMENTS

First Embodiment

Figure 1:
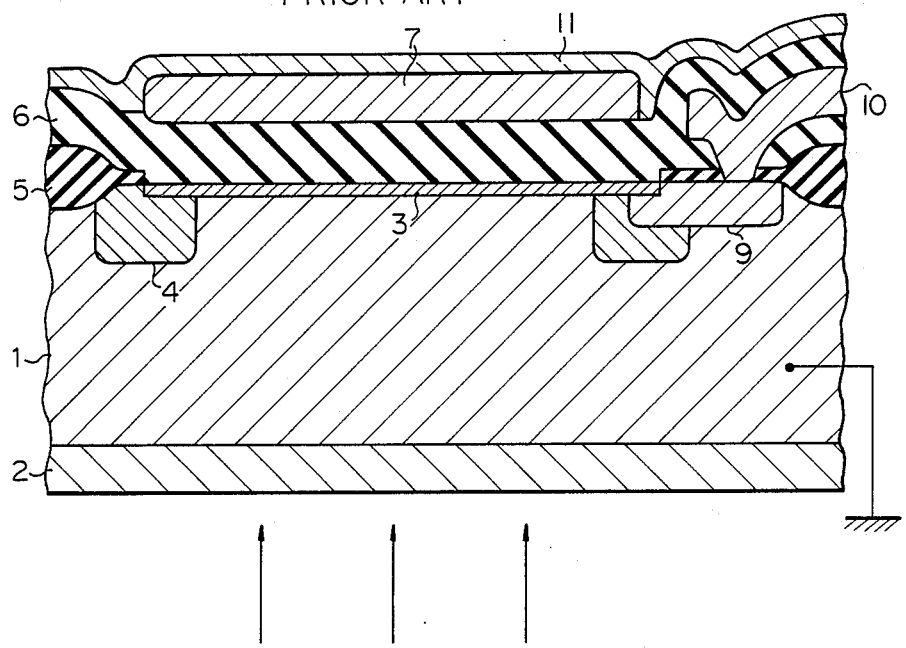
FIG. 1 is a cross-sectional view showing the structure of a prior-art PtSi infrared Schottky-barrier detector.
Figure 2:
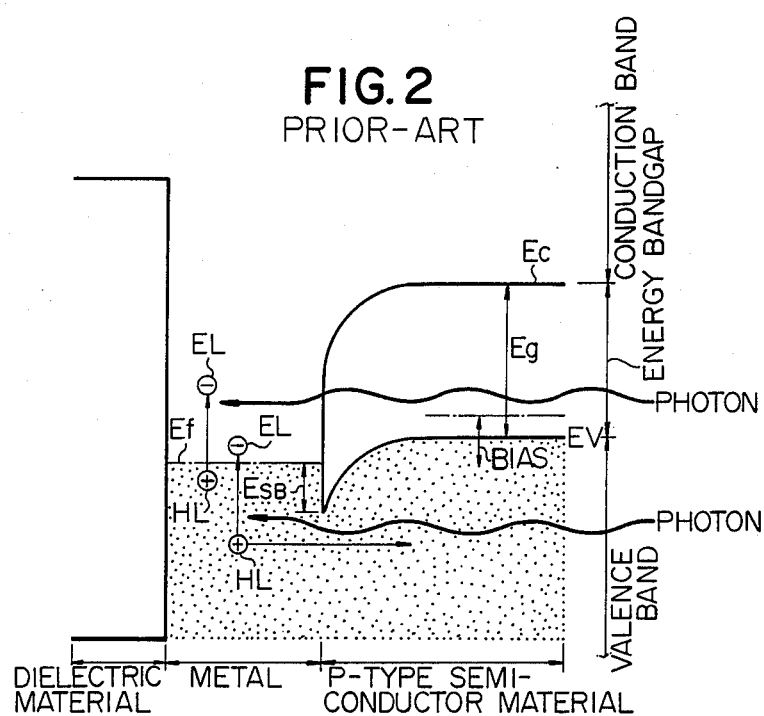
FIG. 2 is an energyband diagram of an infrared Schottky-barrier detector using a metal and a p-type semiconductor material for formation of the Schottky-barrier therebetween.
Figure 3:
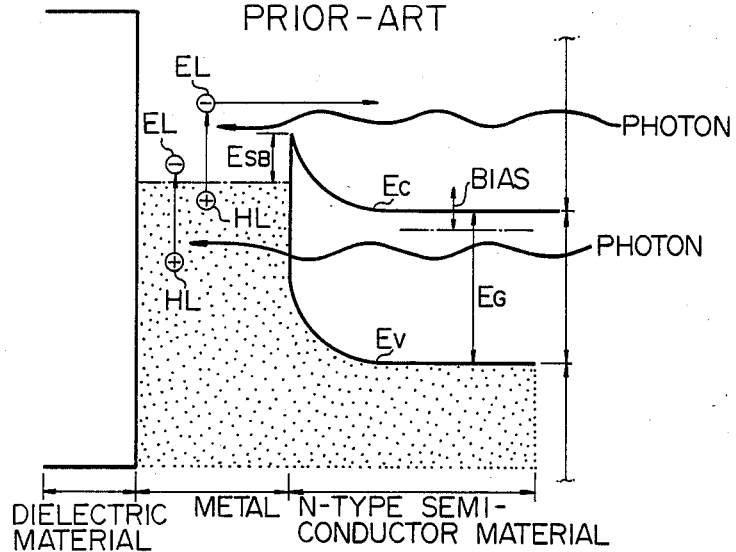
FIG. 3 is an energyband diagram of an infrared Schottky-barrier detector using a metal and an n-type semiconductor material for formation of the Schottky-barrier therebetween.
Figure 4:
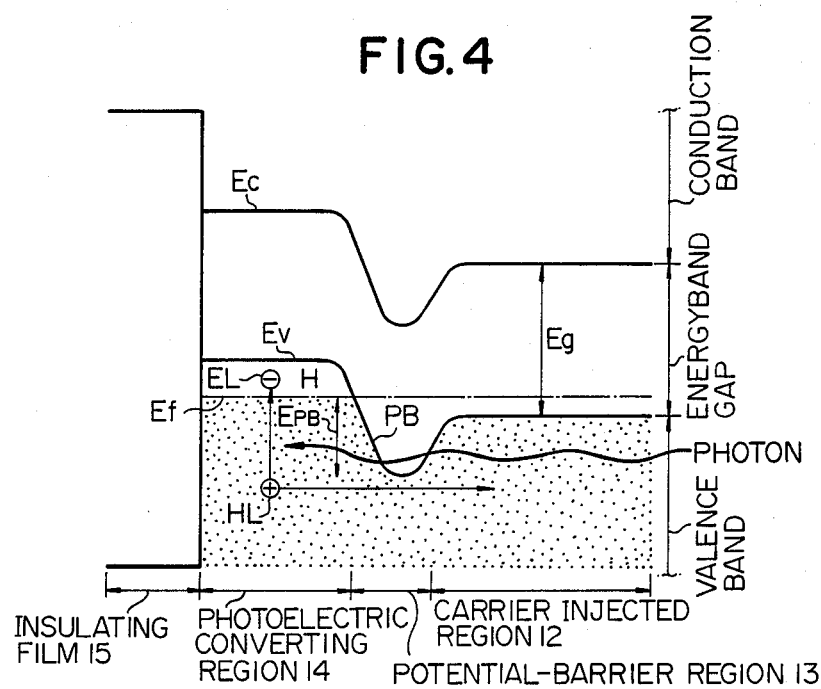
FIGS. 4 and 5 are energyband diagrams of an optoelectric transducer embodying the present invention in thermal equilibrium and in a biassed condition, respectively.
Figure 5:
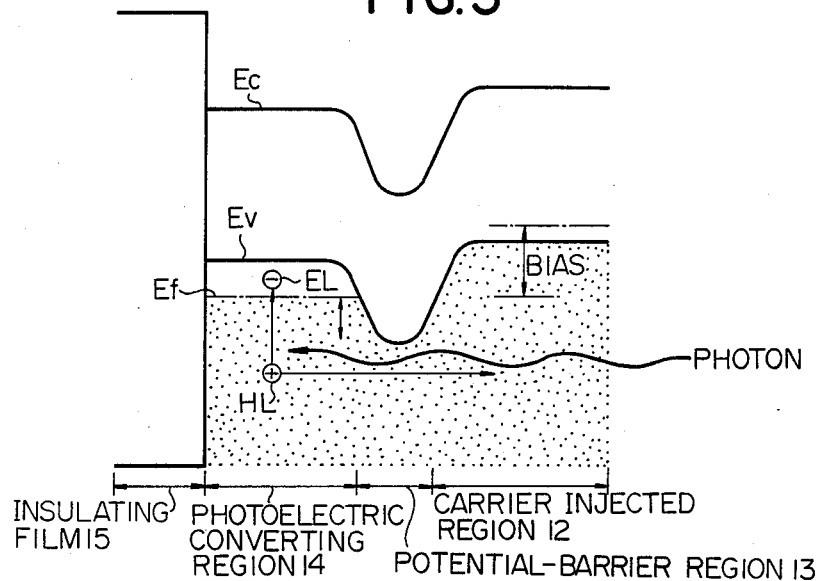

Referring to FIGS. 4 and 5, energybands of an optoelectric transducer according to the present invention are illustrated in thermal equilibrium and in a biassed condition, respectively, and the optoelectric transducer largely comprises a carrier injected region 12 of a lightly doped p-type semiconductor material, a potential-barrier region 13 of an n-type semiconductor material, a photoelectric converting region 14 of a heavily doped degenerative p-type semiconductor material, an insulating film 15 and a metallic mirror ( not shown ), and these regions and film 12 to 15 are stacked in succession to form an optical cavity for producing an optical resonance phenomenon together with the metallic mirror. In this embodiment, the optoelectric transducer serves as an infrared detector.

In general, a p-type non-degenerative semiconductor material has an acceptor level located in the vicinity of the edge of the valence band. However, the photoelectric converting region 14 is formed of the degenerative semiconductor material, so that the acceptor level is diffused to be overlapped into the valence band of the semiconductor material. In this situation, the Fermi level Ef of the degenerative semiconductor material is located within the valence band thereof, so that vacant levels H take place between the Fermi level Ef and the edge of the valence band Ev.

On the other hand, the carrier injected region 12 is formed of a non-degenerative semiconductor material, so that the Fermi level Ef is located in the vicinity of the edge of the valence band of the non-degenerative semiconductor material. The potential-barrier region 13 between the carrier injected region 12 and the photoelectric converting region 14 should be formed of a p- type semiconductor material with an acceptor impurity concentration less than that of the carrier injected region 12 or, alternatively, of an intrinsic semiconductor material, however if the potential-barrier region 13 is formed of an n-type semiconductor material, the donor impurity atom concentration and the thickness thereof should be selected in such a manner that the potential-barrier region 13 is perfectly depleted by a depletion layer extending from the junction between the photoelectric converting region 14 and the potential-barrier region 13 and by a depletion layer extending from the junction between the carrier injected region 12 and the potential-barrier region 13. For this reason, the Fermi level Ef of the potential-barrier region 13 is located at the closest position to the conduction band of the three. As a result, potential-barriers take place between the carrier injected region 12 and the potential-barrier region 13 and between the potential-barrier region 13 and the photoelectric converting region 14, respectively. These potential-barriers are operative to block traveling holes in the valence band, and the height of the potential-barrier PB at the junction between the potential-barrier region 13 and the photoelectric converting region 14 is designated by abbreviation $E_{PB}$ in FIG. 4.

In the infrared detector thus formed, incident rays with energy levels greater than that of the energyband gap Eg are absorbed in the vicinity of the incident surface portion of the carrier injected region 12, however detectable infrared rays, which have respective photon energies less than that of the energyband gap Eg, are hardly absorbed in the carrier injected region 12 and the potential-barrier region 13 and, for this reason, reach the photoelectric converting region 14. In the photoelectric converting region 14, some of the electrons occupying the energy levels of the valence band below the Fermi level Ef absorb the photon energies each represented by hv where h is the Plank constant and v is frequency of each ray, thereby being excited to make transitions from the respective energy levels below the Fermi level Ef to vacant levels H. Then, hot electrons EL and hot holes HL are produced in the photoelectric converting region 14 and isotropically move therein until recombination. Some of the hot holes arriving at the potential-barrier PB have the respective larger energies sufficient to exceed the potential barrier height PB and the component of the quantity of motion which are normal to the traversing area of the potential-barrier region 13 is greater than the potential barrier height EPB in view of the converted energy, so that these hot holes exceed the potential-barrier PB and are injected into the carrier injected region 12. Then, the injected hot holes HL and the remaining hot electrons EL participate respective signal currents.

Second Embodiment

Referring to FIGS. 6 and 7, energybands of another optoelectric transducer according to the present invention are illustrated in thermal equilibrium and in a biassed condition, respectively, and the infrared detector largely comprises a carrier injected region 16 of a lightly doped n-type semiconductor material, a potential-barrier region 17 of a p-type semiconductor material, a photoelectric converting region 18 of a heavily doped degenerative n-type semiconductor material, an insulating film 19 and a metallic mirror (not shown), and these regions and film 16 to 19 are stacked in succession to form an optical cavity for producing an optical resonance phenomenon together with the metallic mirror. The optoelectric transducer also serves as an infrared detector.

In general, an n-type non-degenerative semiconductor material has a donor level in the vicinity of the edge of the conduction band. However, the photoelectric converting region 18 is formed of the degenerative semiconductor material, so that the donor level is diffused to be overlapped into the conduction band of the semiconductor material. In this situation, the Fermi level Ef of the degenerative semiconductor material is located within the conduction band thereof, so that energy levels between the Fermi level Ef and the edge of the conduction band Ec are occupied by electrons.

On the other hand, the carrier injected region 16 is formed of a non-degenerative semiconductor material, so that the Fermi level Ef is located in the vicinity of the edge of the conduction band of the non-degenerative semiconductor material. The potential-barrier region 17 between the carrier injected region 16 and the photoelectric converting region 18 should be formed of an n-type semiconductor material with a donor impurity atom concentration less than that of the carrier injected region 16 or, alternatively, of an intrinsic semiconductor material, however if the potential-barrier region 17 is formed of a p-type semiconductor material, the acceptor impurity atom concentration and the thickness thereof should be selected in such a manner that the potential-barrier region 17 is perfectly depleted by a depletion layer extending form the junction between the photoelectric converting region 18 and the potential-barrier region 17 and by a depletion layer extending from the junction between the carrier injected region 16 and the potential-barrier region 17. For this reason, the Fermi level Ef of the potential-barrier region 17 is located at the closest position to the valence band of the three. As a result, potential-barriers take place between the carrier injected region 16 and the potential-barrier region 17 and between the potential-barrier region 17 and the photoelectric converting region 18, respectively. These potential-barriers are operative to block electrons in the conduction band, and the energy gap of the potential-barrier PB between the potential-barrier region 17 and the photoelectric converting region 18 is designated by abbreviation $E_{PB}$ in FIG. 6.

In the infrared detector thus formed, incident rays with energy levels greater than that of the energyband gap Eg are absorbed in the vicinity of the incident surface portion of the carrier injected region 16, however detectable infrared rays, which have respective photon energies less than that of the energyband gap Eg, are hardly absorbed in the carrier injected region 16 and the potential-barrier region 17 and, for this reason, reach the photoelectric converting region 18 as similar to the infrared detector described in conjunction with FIG. 4. In the photoelectric converting region 18, some of the electrons occupying the energy levels of the conduction band between the Fermi level Ef and the edge of the conduction band Ec absorb the photon energies each represented by hv where h is the Plank constant and v is frequency of each ray, thereby being excited to make transitions from the respective energy levels below the Fermi level Ef to energy levels over the Fermi level Ef, respectively. Then, hot electrons EL and hot holes HL are produced in the photoelectric converting region 18 and isotropically move therein until recombination. Some of the hot electrons arriving at the potential-barrier PB have the respective energies larger than the potential barrier height PB and the respective components of the quantities of motion which are normal to the traversing area of the potential-barrier region 17 are greater than the potential barrier PB in view of converted energy, so that these hot electrons exceed the potential-barrier PB and are injected into the carrier injected region 16. Then, the injected hot electrons EL and the remaining hot holes HL participate in respective signal currents.

The photoelectric conversion basically takes place in the infrared detector due to electron transitions as described hereinbefore, however if some photons are larger in energy level than the energyband gap Eg, the photons cause some electrons in the neighborhoods of the junctions to make transitions from the valence band to the conduction band, thereby allowing another photoelectric conversion to take place. If the infrared detector is of the front illuminated type or of the back illuminated type with thin regions sufficient to allow the photon fluxes to pass therethrough, the probability of above mentioned photoelectric conversion is relatively large, and it may be formed a photodetector using the above mentioned photoelectric conversion for detecting rays except for the infrared region. An appropriate short-circuit is provided for detection of the rays with energies larger than the energyband gap, and the short-circuit will be described hereinunder in detail.

Structure of the Infrared Detector

Figure 8:
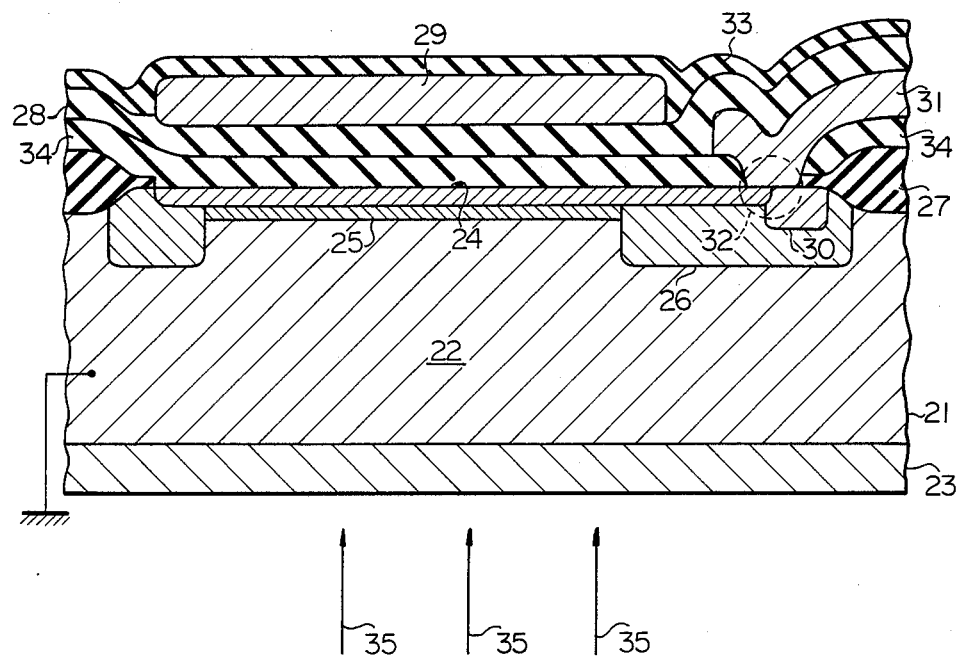
FIG. 8 is a cross-sectional view showing the structure of an example of the optoelectric transducer the energybands of which are illustrated in FIGS. 4 and 5.

FIG. 8 is a cross-sectional view showing an example of the structure of the infrared detector having the energybands illustrated in FIGS. 4 and 5. The infrared detector is of the back illuminated type and fabricated on a single crystal p-type silicon substrate 21 with polished surfaces on the both sides thereof, however another semiconductor material is available to fabricate a discrete type infrared detector in accordance with the present invention.

In the single crystal p-type silicon substrate 21, a bulk portion serves as a carrier injected region 22, and an antireflection film 23 of, for example, silicon oxides ( SiO or $SiO_2$) is formed on the back surface of the silicon substrate 21. The front side portion is heavily doped with p-type impurity atoms to form a degenerate semiconductor region serving as a photoelectric converting region 24, and a potential-barrier region 25 is formed between the photoelectric converting region 24 and the carrier injected region 22. The potential-barrier region 2 is of a p-conductivity type lower in impurity density than the carrier injected region 22 or, alternatively, an intrinsic silicon material. However, another implementation has a potential-barrier region of an n-conductivity type, but the n-type impurity density and the thickness thereof should be selected in such a manner that the potential-barrier region turns into the perfect depletion state under the usual operation.

In an implementation which has a p-type carrier injected region, a p-type photoelectric conversion region and an n-type potential-barrier region, the photoelectric conversion region has a thickness ranging between 10 nano-meters and 500 nano-meters and an impurity atom concentration in stepped distribution ranging between $10^{18}$ cm$^{-3}$ and the uppermost solid solubility. The potential-barrier region can be selected to have an arbitrary geometry and an arbitrary impurity atom concentration, however if the silicon substrate 21 has an impurity atom concentration of about $1 \times 10^{15}$ cm$^{-3}$ and the potential-barrier region has a thickness ranging between 200 nano-meters and 300 nano-meters and an impurity atom distribution profile tracing a half of the Gaussian distribution curve with a peak value ranging between $3 \times 10^{16}$ cm$^{-3}$ and $5 \times 10^{16}$ cm$^{-3}$, a potential-barrier height of 0.5 eV takes place under non-biassed condition and the potential-barrier is decreased in height to be 0.2 eV under positive bias voltage of 5 volts. Although the silicon substrate is similar to the above example, the potential-barrier region is not perfectly depleted if the potential-barrier region is about 500 nano-meters thick with a stepped impurity distribution of about $1 \times 10^{16}$ cm$^{-3}$. In this example, the potential-barrier region is perfectly depleted under a positive biased condition equal to or greater than 1.5 volt.

An n-type guard ring 26 is formed around the photoelectric conversion region 24 and the potential-barrier region 25 for the sake of reduction of edge effect, and the potential-barrier region 25 is sufficiently overlapped into the guard ring 26 because the detector can not operate with a photoelectric conversion region directly contacting the carrier injected region 22. On the front surface of the silicon substrate 21 is thermally grown a thick silicon dioxide layer 27 which defines the photoelectric conversion region 24, and the entire surface of the silicon dioxide layer 27 and the photoelectric conversion region 24 is covered with an insulating material of, for example, SiO and/or $SiO_2$ deposited by using a chemical-vapor-deposition technique to form an insulating film 28. A silicon nitride film of, for example, SiN and/or $Si_3N_4$ is alternatively deposited on the silicon dioxide film 27 and the photoelectric conversion region 24, however a thin silicon oxide film is formed to preferably cover the photoelectric conversion region 24 prior to the deposition of the silicon nitride film because of reduction in mechanical stress due to difference in thermal expansion coefficient between silicon nitride and single crystal silicon. On the insulating film 28 is formed a metallic mirror 29 of, for example, aluminum for the sake of reusing the rays passing through the photoelectric conversion region 24. By virtue of a multiple layer structure consisting of a carrier injected region 22, the potential-barrier region 25, the photoelectric conversion region 24, the insulating film 28 and the metallic mirror 29, an optical resonance takes place therein, and the thickness of the insulating film 28 is selected in such a manner that an antinode of a steady wave produced by incident infrared rays with a major wavelength appears in the photoelectric conversion region 24. For example, if the photoelectric conversion region 24 is selected to have an impurity concentration of about $10^{20}$ cm$^{-3}$ and a thickness between 400 nano-meters and 500 nano-meters, the silicon oxide film of $SiO_2$ should be selected to have a thickness of about 1 micron for absorption of infrared rays with a wavelength ranging between 1.5 micron and 2.0 microns and between 3.0 microns and 4.0 microns In order to extract electric charges produced by the photoelectric conversion, a propagation path (not shown) forming part of the photoelectric conversion region 24 is formed from the junction between the photoelectric conversion region 24 and the potential-barrier region 25 into the n-type guard ring 26, and the propagation path is contacted to an heavily doped n-type impurity region 30. The heavily doped n-type impurity region 30 and a metal wiring layer 31 of, for example, aluminum form an ohmic contact therebetween. The metal wiring layer 31 allows the propagation path in the photoelectric conversion region 24 and the heavily doped n-type impurity region 30 to form an alloy for electric connection therebetween.

In this instance, a short-circuit 32 between the photoelectric conversion region 24 and the potential-barrier region 25 is formed by the n-type guard ring 26, the heavily doped n-type impurity region 30, the propagation path in the photoelectric conversion region 24 and the metal wiring layer 31, and the entire surface of the structure is overlain by a passivation film 33. The function of the short-circuit 32 is described as follows. Namely, a transition of electron takes place due to thermal excitement regardless of the incident rays each having energy larger than the energyband gap Eg. The probability of this transition is not zero. If electrons make the transitions in the vicinity of the junctions, the electrons in the conduction band are gathered in the minimum potential portion of the conduction band in the case of the infrared detector with he energyband illustrated in FIG. 4. On the other hand, if the infrared detector has the energyband illustrated in FIG. 6, the holes left in the band are gathered in the vicinity of the maximum potential portion of the valence band in the potential-barrier region ( with the minimum potential with respect to the hole ). These free carriers in the potential-barrier portion should be eliminated, so that the short-circuit 32 is provided between the photoelectric converting region and the potential-barrier region for electrical coupling therebetween. If the infrared detector has the p-type photoelectric converting region, the holes in the valence band are transferred to the carrier injected region as a result of the energyband transitions of the electrons. However, if the infrared detector has the n-type photoelectric converting region, the electrons produced by the transitions are transferred to the carrier injected region. In either case, the electron-hole pairs produced by the energyband transitions are recombined through the short circuit 32, so that these electron-hole pairs separated between the photoelectric converting region and the potential-barrier region can not participate the signal currents. However, if the electron-hole pairs are separated between the potential-barrier region and the carrier injected region, these carriers can be independently extracted from those regions to the outside thereof as electric signals. Additionally, if a large amount of dark current takes place in the infrared detector according to the present invention, the infrared detector should be cooled for stable operation.

As will be understood from the foregoing description, the infrared detector according to the present invention is advantageous over the Schottky-barrier infrared detector as follows.

(1) The photoelectric converting region is formed of the semiconductor material similar to those of the remaining regions, so that it is possible to form the photoelectric converting region by using a single crystal semiconductor material. This results in reduction of scattering centers for the hot holes or the hot electrons in comparison with the prior-art Schottky-barrier detector. Then, the lifetime of the hot hole or the hot electron is prolonged.

(2) The homojunctions are formed between the carrier injected region and the potential-barrier region and between the potential-barrier region and the photoelectric converting region, so that the junctions have respective improved boundary properties. This results in improvement in carrier injection efficiency.

(3) In the infrared detectors according to the present invention, the range of wavelength available is also represented by inequality (1), replacing $E_{SB}$ to $E_{PB}$. Then, the infrared detector can detect the rays identical with those detected by the prior-art Schottky-barrier infrared detector. However, a smaller amount of photon energy is consumed with the hot hole having an energy level lower than the potential-barrier height $E_{PB}$ in the p-type photoelectric converting region or with the hot electron having an energy level lower than the potential-barrier height $E_{PB}$ in the n-type photoelectric converting region in comparison with the prior-art Schottky-barrier infrared detector. This is because of the fact that the vacant levels capable of occupation of an excited electron are limited between the Fermi level Ef and the edge of the valence band Ev in the p-type photoelectric conversion region and that electrons capable of making transitions are occupied in a limited region between the edge of the conduction band Ec and the Fermi level Ef. By virtue of the above mentioned limited distribution of the vacant levels or electrons, the hot holes due to absorption of incident rays each having photon energy hv greater than the potential-barrier height but not greater than the sum of the potential-barrier height and the energy difference dE between the Fermi level Ef and the edge of the valence band Ev have respective energies not larger than that of the potential barrier PB in so far as each of the hot holes is produced by transition of an electron occupying an energy level Ee'' represented as follows $$Ef - PB \leq Ee'' \leq Ev - hv = Ef - hv + dE$$

where dE is the difference between the Fermi level Ef and the edge of the valence band Ev in the photoelectric converting region of the p-type degenerative semiconductor material.

If the photoelectric converting region is formed of an n-type degenerative semiconductor material, hot electrons due to absorption of incident rays each having a photon energy greater than the potential-barrier height but not greater than the sum of the potential-barrier height and the energy difference between the Fermi level and the edge of the conduction band have respective energy not larger than the potential-barrier height in so far as the hot electron is produced by transition from an energy level Ee''' represented as follows.

$$Ec \leq Ee''' \leq Ef + PB - hv$$

Note that there is a small possibility of hot carrier injection from photoelectric converting region to the carrier injected region by virtue of the tunnel effect Moreover, if a infrared detector is formed of a semiconductor material with a wide energyband gap, the range of detectable wavelength may partially overlap the visible range. If the infrared detector is of the front illuminated type or of the back illuminated type with thin layers capable of allowing the incident rays to pass therethrough, the range of available photon energies exceed the energyband gap Eg as similar to the prior-art Schottky-barrier infrared detector.

(4) In the infrared detector according to the present invention, the cut-off wavelength follows the potential-barrier height, and the potential-barrier height is changeable by changing the conductivity type, the impurity atom concentration and the thickness of the potential-barrier region. Then, the potential-barrier height is arbitrary selected by a designer but may be limited to the diffusion potential difference formed by a p-n junction between usual semiconductor materials. This results in that the cut-off wavelength can be optimized in consideration of the capability of a cooling unit. Finally, the potential-barrier height has a biasing voltage dependency as illustrated in FIGS. 5 and 7, so that the biasing condition should be taken into account.

Fabrication process of the infrared detector illustrated in FIG. 8 is described hereinunder. Starting material is a polished single crystal silicon substrate 21 having a thickness between 300 microns and 500 microns and an p-type impurity atom concentration of about $10^{15}$ cm$^{-3}$. The silicon substrate is placed in an oxidation ambient to form a thermal oxide film of SiO$_2$, and a window is formed in the thermal oxide film to expose an ohmic contact forming area of the silicon substrate 21 for formation of an ohmic contact between the p-type silicon substrate 21 and an aluminum wiring layer ( not shown ) grounded. P-type impurity atoms are diffused into the ohmic contact forming area of the silicon substrate 21 by using the thermal oxide film as a mask, and, thereafter, the silicon substrate 21 is placed in an oxidation ambient to form a thick thermal oxide layer of, for example, SiO$_2$ and concurrently to cause the p-type impurity atoms in the ohmic contact forming area to be deeply driven into the semiconductor substrate 21. Subsequently, a window is formed in the thick thermal oxide layer to expose a guard ring forming area, and n-type impurity atoms such as, for example, phosphorus atoms are implanted into the guard ring forming area of the silicon substrate 21, and, then, a heat treatment is applied to the silicon substrate 21 to activate the implanted impurity atoms which are concurrently driven into the semiconductor substrate 21, thereby forming the n-type guard ring 26.

Subsequently, the silicon dioxide covering the entire surface is removed, and, thereafter, a fresh silicon oxide film is thermally grown on the entire surface. On the entire surface of the thermal silicon oxide film is deposited a silicon nitride film ( SiN$_x$) which is selectively removed to expose the silicon oxide over that area surrounded by the n-type guard ring 26, then the silicon substrate 21 is placed in an oxidation ambient to form a thick silicon dioxide film of about 800 nano-meters by the LOCOS ( local-oxidation ) technique. After the removal of the entire silicon nitride film, the thick silicon dioxide film covering an ohmic contact forming area is selectively removed to form a mask for a diffusion of n-type impurity atoms such as, for example, phosphorus atoms. Then, the n-type impurity atoms are heavily doped into the ohmic contact forming area of the silicon substrate 21 to an impurity atom concentration of greater than $10^{18}$ cm$^{-3}$, thereby forming the heavily doped n-type impurity region 30 for forming an ohmic contact between the n-type guard ring 26 and an aluminum wiring layer. During the impurity atom diffusion, the thick silicon dioxide film is partially converted into phosphosilicate glass, so that the converted portion of the thick silicon dioxide film is removed, and the thick silicon dioxide film 27 is formed over that area surrounded by the guard ring 26. A fresh silicon oxide film is thermally grown on the single crystal silicon substrate 21 again, and the silicon substrate 21 is applied with a heat, then the doped n-type impurity atoms are driven into the silicon substrate 21 to form the heavily-doped n-type impurity region 30 with a depth of about 500 nano-meters and an impurity atom concentration between $10^{17}$ cm$^{-3}$ and the uppermost solid solubility.

After formation of the heavily-doped n-type impurity region 30, a metal layer containing aluminum is formed on the entire surface of the structure, and the metal layer and the silicon oxide film over that area for the photoelectric conversion region are successively removed to exposed the surface of the silicon substrate 21. First, n-type impurity atoms such as, for example, phosphorus atoms or arsenic atoms are implanted into the silicon substrate 21, and an implantation of p-type impurity atoms such as, for example, boron atoms or gallium atoms follows the implantation of n-type impurity atoms. The two ion implantations should meet certain conditions for forming the potential-barrier region 25 and the photoelectric converting region 24 both having predetermined electric properties and depths, respectively. Let us assume that the photoelectric conversion region 24 has a thickness of about 400 nano-meters and an impurity atom concentration of about $1 \times 10^{20}$ cm$^{-3}$ and that the potential-barrier region 25 has a thickness between 200 nano-meters and 300 nano-meters, having an impurity atom distribution profile tracing the half of the Gaussian distribution curve with a peak value of an impurity atom concentration between $3 \times 10^{16}$ cm$^{-3}$ and $5 \times 10^{16}$ cm$^{-3}$, phosphorus atoms are firstly implanted at doses of about $1 \times 10^{12}$ cm$^{-2}$ in about 280 KeV, then implanting boron atoms at doses of $5 \times 10^{14}$ cm$^{-2}$ in 10 KeV, then implanting boron atoms at doses of $7 \times 10^{14}$ cm$^{-2}$ in 30 KeV, then implanting boron atoms at doses of $1.5 \times 10^{15}$ cm$^{-2}$ in 50 KeV. After successive ion implantations, the metal layer is removed and a heat treatment is applied to the silicon substrate to activate the implanted impurity atoms and, concurrently, cure the crystal structure of the silicon substrate 21. For this reason, the heat-treatment is carried out in an electric furnace at about 900 degrees in centigrade for 10 to 20 minutes, so that the impurity atom profiles are substantially identical with those before the heat-treatment. Thus, it is desirable that no high-temperature process at a temperature, for example, higher than 800 degrees in centigrade is applied to the silicon substrate 21 after formation of the photoelectric region 24 and the potential-barrier region 25.

In the subsequent step, an insulating layer of, for example, silicon dioxide is deposited on the entire surface of the photoelectric conversion region 24 and the thick silicon dioxide film 27 by a chemical vapor deposition technique to a thickness appropriate for formation of the metal wiring layer 31, which is 200 nano-meters to 300 nano-meters thick by way of example. A contact window is formed in the silicon dioxide film 27 and the insulating layer 34 which overly that area around the junction between the propagation path and the heavily doped impurity region 30 and ohmic contact forming area. Then, a metal layer of, for example, aluminum is deposited on the entire surface of the structure and, then, is etched and patterned to form the metal wiring layer 31. A heat treatment is applied to the silicon substrate for alloying the contact boundary among the propagation path of the photoelectric conversion region 24, the heavily-doped n-type region 30 and the metal wiring layer 31 and for further alloying the contact boundary among the p-type silicon substrate, a p-type ohmic contact forming area (not shown) and the metal wiring layer 31. In order to avoid the change of the impurity atom distribution profiles, the heat treatment is carried in an relatively low temperature of about 450 degrees in centigrade for about 10 minutes. After formation of the metal wiring layer 31, an insulating layer of, for example, silicon dioxide ( $SiO_2$) or silicon nitride ($Si_3N_4$) is deposited on the entire surface of the structure. The thickness is selected in such a manner that the multiple layer structure has a thickness appropriate to producing the optical resonance phenomenon therein. If the insulating layer is formed of silicon dioxide, the thickness is selected to be about 700 nano-meters to 800 nano-meters. On the other hand, the insulating layer is formed of silicon nitride, the thickness may be selected to be about 500 nano-meters. These conditions may be appropriate to form an optical cavity described hereinbefore. A protection film of, for example, polysilicon is applied to the entire surface of the insulating layer 28, and, thereafter, undesirable silicon oxide and/or silicon nitride films covering the back surface of the silicon substrate 21 are removed to expose a clean surface. On the back surface of the silicon substrate is deposited silicon oxide (SiO) or silicon dioxide ($SiO_2$) by a chemical vapor deposition technique to form the anti-reflection film 23. After formation of the anti-reflection film 23, the protection film is removed, which is followed by formation of a covering film on the anti-reflection film 23, and, then, a metal film containing aluminum is formed by a deposition technique. The metal layer is etched and patterned to form the metallic mirror 29 by using a lithographic technique, and silicon dioxide is deposited on the entire front surface of the structure to form the passivation film 33. Finally, a contact hole is formed in the passivation film 33 and the insulating film 28 to expose a bonding pad (not shown) connected to a bonding wiring. The covering film on the anti-reflection film 23 is removed after formation of the contact hole for the bonding wiring.

As will be understood from the foregoing description, the fabrication process of the infrared detector illustrated in FIG. 8 does not need a complicate step. In this instance, the ion implantation techniques are applied to form the potential-barrier region 25 and the photoelectric conversion region 24, however epitaxial growing techniques can be used instead of the ion implantations. For example, after formation of the heavily doped n-type impurity region 30 in a p-type silicon substrate with an impurity atom concentration of about $1 \times 10^{17}$ cm$^{-3}$, on the exposed front surface of the silicon substrate 21 is epitaxially grown a p-type silicon film which has a thickness of about 1 micron and a boron atom concentration of about $1 \times 10^{15}$ cm$^{-3}$, but an intrinsic silicon material is available for the epitaxial film. When the epitaxial layer is grown on the exposed front surface of the silicon substrate, boron atoms are successively implanted at doses of about $5 \times 10^{14}$ cm$^{-2}$ in 10 Kev, then, at doses of about $7 \times 10^{14}$ cm$^{-2}$ in 30 KeV and at doses of about $1.5 \times 10^{15}$ cm$^{-2}$ in 50 KeV. After the ion implantations, the process returns to the steps described in conjunction with the infrared detector illustrated in FIG. 8. The infrared detector thus formed has a p-type potential-barrier region of about 400 nanometers thick or, alternatively, an intrinsic potential-barrier region of about 500 nano-meters thick.

Another implementation is fabricated on an n-type silicon substrate with an n-type impurity atom concentration of, for example, $1 \times 10^{15}$ cm$^{-3}$, and boron atoms and phosphorus atoms are exchanged to each other for the diffusions and the ion-implantations carried out in the above described fabrication process. For example, a potential-barrier region and a photoelectric conversion region are formed by implanting boron atoms at doses of about $1 \times 10^{12}$ cm$^{-2}$ in 140 KeV, implanting phosphorus atoms at doses of about $4 \times 10^{14}$ cm$^{-2}$ in 30 KeV, implanting phosphorus atoms at doses of about $7 \times 10^{14}$ cm$^{-2}$ in 70 KeV, then implanting phosphorus atoms at doses $2 \times 10^{15}$ cm$^{-2}$ in 130 KeV. Although the n-type impurity regions and the p-type impurity regions are exchanged, the geometry and the other impurity concentrations are identical with those of the infrared detector fabricated on the p-type silicon substrate 21. Moreover, in a discrete-type implementation, another semiconductor material such as, for example, germanium or gallium-arsenide may be used as a starting material, however mask layers for diffusions and ion-implantations are hardly formed by thermal oxidation of the starting material, so that the thermal oxidation films used in the fabrication process for the infrared detector illustrated in FIG. 8 are replaced by some insulating films formed by chemical vapor deposition techniques. The potential-barrier region may be of the n-type or intrinsic material in so far as the impurity atom concentration is not greater than that of the substrate.

A function of the infrared detector illustrated in FIG. 8 is hereinunder described with assumption of infrared rays 35 incident upon the back surface through the anti-reflection film 23. The infrared rays 35 pass through the carrier injected region 22 and the potential-barrier region 25 and are, then, absorbed by the photoelectric conversion region 24. Then, electric charges take place as a result of the photoelectric converting phenomenon. In this instance, the p-type silicon material is used to form the photoelectric conversion region 24, so that hot-holes are transferred into the carrier injected region 22, leaving hot-electrons in the photoelectric conversion region 24. On the other hand, if an infrared detector has an n-type photoelectric conversion region, hot-electrons are transferred into a carrier injected region, but hot-holes remain in the photoelectric conversion region. As will be seen from FIG. 8, the carrier injected region 22 is grounded for discharging the carriers therein, however the carriers are extracted from the photoelectric conversion region 24 to the outside thereof through the metal wiring layer 31.

Figure 9:
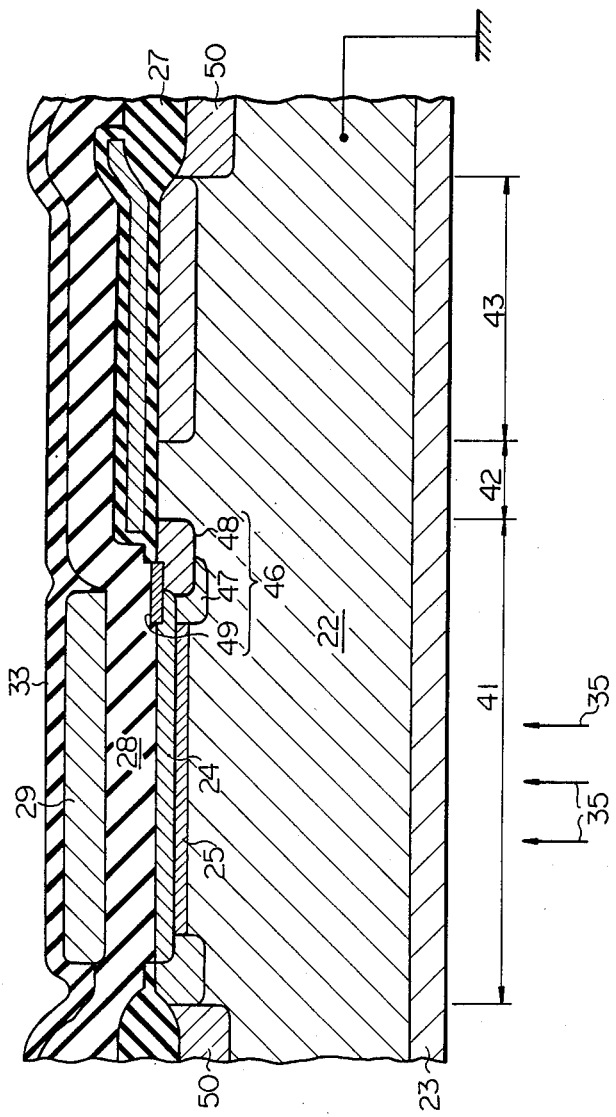
FIG. 9 is a cross-sectional view showing the structure of another infrared detector of the present invention applied to an image sensor.
Figure 10:
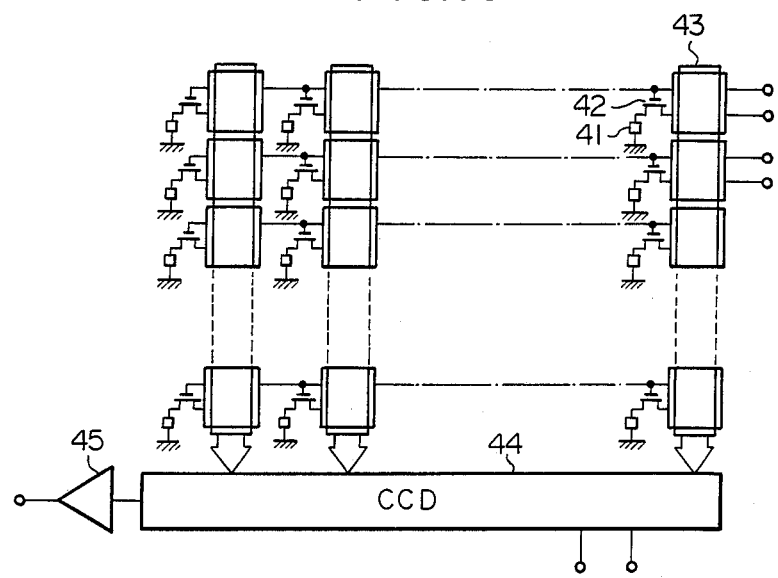
FIG. 10 is a diagram showing the circuit arrangement of the image sensor the pixel of which is illustrated in FIG. 9.

Turning to FIG. 9 of the drawings, there is shown another structure of the infrared detector incorporated in image sensor of the CCD ( charge-coupled-device ) type. The image sensor is of the interline-transfer type and comprises a plurality of pixels arranged in array. Each of the pixels comprises an infrared detector 41, a transfer gate 42 and a vertical charge-coupled-device 43. These components of each pixel are illustrated in FIG. 10 together with a horizontal charge-coupled-device 44 and an output circuit 45. The infrared detector 41 is similar in construction to that illustrated in FIG. 8 except for a short circuit 46, so that regions and films forming parts of the infrared detector illustrated in FIG. 9 are denoted by like reference numerals designating the corresponding regions and layers and, for this reason, detailed description thereof will be omitted for the sake of simplicity.

Using a p-type single crystal silicon substrate, the short circuit of the infrared detector 41 comprises an n-type guard ring 47 with a thickness between 1 micron and 2 microns, an n-type heavily doped impurity region 48 having a thickness of about 1 micron and impurity atom concentrations from $10^{17}$ cm$^{-3}$ to the solid solubility, and a silicide film with a thickness of about 100 nano-meters. Ohmic contacts are formed at both junctions between the photoelectric converting region 24 and the silicide film 49 and between the heavily doped impurity region 48 and the silicide film 49. The silicide film 47 is replacable with a metal layer, however the silicide is desirable because of stable properties and its reliability. Moreover, the heavily doped impurity region 48 extends to the outside of the guard ring 47, and the extension of the heavily doped impurity region 48 serves as a source region of the transfer gate 42.

The vertical charge-coupled-device 43 is of the buried channel type, and the thick silicon dioxide film 27 is formed to have a thick portion of about 800 nano-meters for causing the charge-coupled-device 43 to have a channel reduced in width in the direction perpendicular to the carrier-transfer. The charge-coupled-device 43 further has a heavily doped p-type channel stopper region 50 which has a thickness between 1 micron and 2 micron and an impurity atom concentration ranging between $10^{17}$ cm$^{-3}$ and the solid solubility, and the channel stopper region 50 is also arranged to reduce the channel width. However, the other portion of the vertical charge-coupled-device is protected by the thick silicon dioxide film 27 and the channel stopper 50 extending on both sides thereof.

As described hereinbefore, the image sensor is of the interline type, so that vertical and horizontal scannings for the pixel array are carried out by the vertical charge-coupled-device 43 and the horizontal charge-coupled-device 44, respectively. The vertical charge-coupled-device 43 is applied with four-phase driving clock, but the horizontal charge-coupled-device 44 is supplied with two-phase driving clock. The photo signal is transferred from the output circuit 45 coupled to the horizontal charge-coupled-device 44 to the destination. It is possible to form an image sensor by using an n-type single crystal silicon substrate.

The infrared detector 41 is similar in function to the infrared detector illustrated in FIG. 8. The photoelectric conversion is carried out in the accumulation mode thereof where the transfer gate 42 is turned off, so that the infrared detector is biassed as shown in FIG. 5 depending upon the conductivity type of the photoelectric converting region 24. When the incident infrared rays reach the photoelectric converting region 24, electric charges are produced in the photoelectric converting region 24 but are accumulated in the photoelectric converting region 24, the guard ring, the heavily doped impurity region and the silicide film. By the way, if the photoelectric converting region is of the n-type, holes are accumulated therein, and, on the other hand, electrons are accumulated in the case of the p-type photoelectric converting region. During the accumulation of the electric charges, the vertical charge-coupled-device successively accesses the pixels to read out the electric charges as a video signal. Namely, upon completion of the accumulation, the transfer gate 42 of each pixel turns on for transferring the accumulated electric charges form the photoelectric converting region 24 to the vertical charge-coupled-device 43. Then, the transfer gate 42 turns off again, and the infrared detector 41 begins to accumulate the electric charges. All of the electric charges for a single horizontal line are transferred from the vertical charge-coupled-device 43 to the horizontal charge-coupled-device 44 during a single horizontal scanning, and, then, the video signal is transferred from the horizontal charge-coupled-device 44 through the output circuit 45 to the destination. The output circuit 45 largely comprises a capacitor and a source-follower type amplifier and carries out a charge-voltage conversion and an impedance matching to form the video signal in the form of voltage level. The reading-out operation is repeated in every horizontal scanning, so that all of the electric charges accumulated in all pixels are successively read out to the horizontal charge-coupled-device 44 in a single electric charge accumulation period.

There are formed wide variety of solid-state image sensors with other signal transfer techniques such as, for example, the MOS (metal-oxide-semiconductor) type or the single-dimension type, and the infrared detector is applicable to another type of the image sensor. Moreover, it is also possible to form the infrared detectors arranged in array on another semiconductor substrate of, for example, gallium arsenide, and the infrared detectors on the semiconductor substrate is electrically connected to a scanning circuit fabricated on a single crystal silicon substrate to form a hybrid device.

Figure 11:
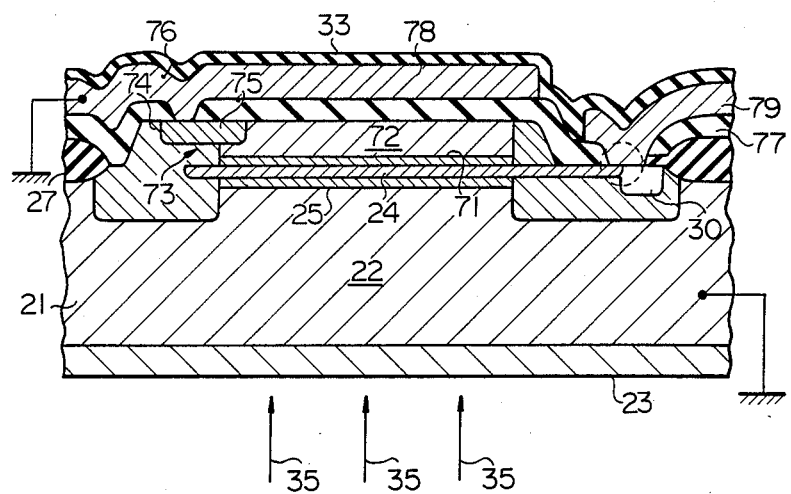
FIG. 11 is a cross-sectional view showing the structure of still another infrared detector according to the present invention.

Turning to FIG. 11 of the drawings, there is illustrated the structure of still another optoelectric transducer using a p-type single crystal silicon substrate. However, it is possible to form the optoelectric transducer by using an n-type single crystal silicon substrate. The optoelectric transducer has regions and layers similar to those of the infrared detector illustrated in FIG. 8, and, for this reason, these regions and layers are designated by like reference numerals used for designation of the corresponding parts. The optoelectric transducer illustrated in FIG. 11 serves as an infrared detector which has double potential-barriers formed on both sides of the photoelectric converting region 24. Namely, the first potential barrier is formed between the photoelectric converting region 24 and the lower potential-barrier region 25 as similar to the infrared detector illustrated in FIG. 8, but the second potential-barrier is formed between the photoelectric converting region 24 and an upper potential barrier-region 71 for serving as a barrier to the majority carriers. The upper potential-barrier region 71 is overlain by an upper carrier injected region 72, and the upper potential-barrier region 71 and the upper carrier injected region 72 are identical in conductivity type with the lower potential-barrier region 25 and the carrier injected region 22, respectively. The hot holes of the p-type photoelectric converting region are injected from both sides of the photoelectric converting region 24 to the lower and upper carrier injected regions 22 and 72, respectively, so that the infrared detector thus arranged is advantageous in improvement of quantum effect. The upper potential-barrier region 71 and the upper carrier injected region 72 are formed in a silicon layer 73 epitaxially grown on the photoelectric converting region 24. The silicon layer 73 is epitaxially grown in a temperature capable of maintaining the impurity atom distribution, and n-type impurity atoms and, thereafter, p-type impurity atoms are doped into the silicon layer 73 to form the upper potential-barrier region 71 and the carrier injected region 72, respectively.

The upper potential-barrier region 71 and the upper carrier injected region 72 are surrounded by an n-type guard ring 74, and the guard ring 74 can be formed by an ion implantation. However, if the silicon layer 73 is large in thickness, the epitaxial growth may be interrupted by the ion implantations for formation of the guard ring 74 because a high temperature heat treatment is hardly adopted for driving the implanted impurity atoms. After ion implantation, the substrate is heated to a relatively low temperature for activation of the impurity atoms and the crystal cure, so that the impurity atom distribution profile is hardly changed by the low temperature heat treatment.

On the epitaxial silicon layer 73 is formed a p-type heavily doped impurity region 75 which provides an ohmic contact between the upper carrier injected region 72 and a metal wiring layer 76. In order to keep the impurity atom distribution profiles, the formation of the ohmic contact is carried out in a relatively low temperature. In the structure illustrated in FIG. 11, unnecessary portions are removed from the epitaxial silicon layer 73. When the silicon layer 73 is epitaxially grown on the photoelectric converting region 24, a polysilicon film is grown on the silicon dioxide layer 27, but this undesirable polysilicon film is simultaneously removed from the silicon dioxide layer 27 in the etching process for the epitaxial silicon layer 73. On the entire surface including the surface of the epitaxial silicon layer 73 is deposited an insulating film 77 by using a chemical-vapor-deposition technique which in turn is overlain by a metallic mirror 78 forming part of the metal wiring layer 76. The metallic mirror 78, the metal wiring layer 76 are simultaneously formed together with a metal wiring layer 79. The metal wiring layer 76 is electrically connected to the heavily doped impurity region 75 through an contact window formed in the insulating layer 77, and, similarly, the metal wiring layer 79 is electrically connected to an electric charge extracting portion of the photoelectric converting region 24 and a heavily doped impurity region 30 through a contact window formed in the insulating layer 77.

The infrared detector thus formed has a multiple layer structure consisting of the lower carrier injected region 22, the lower potential-barrier region 25, the photoelectric converting region 24, the upper potential-barrier region 71, the upper carrier injected region 72, the insulating film 77 and the metallic mirror 78, and a optical resonance takes place in the multiple layer structure. The thicknesses of the epitaxial silicon layer 73 and the insulating film 77 are optimized in such a manner that an antinode is located in the photoelectric converting region 24 for a steady wave produced by the incident infrared rays with a major wavelength in the detectable range. For example, the epitaxial silicon layer 73 is about 300 nano-meters in thick and the insulating film 77 has a thickness ranging between 400 nano-meters and 500 nano-meters for an optical properties similar to those of the infrared detector illustrated in FIG. 8. In this instance, the metallic mirror 78 is merged with the metal wiring layer 76. This is because of the fact that the metallic mirror is located in the vicinity of the contact window for the metallic wiring layer 76, but the metallic mirror may be separated from the metal wiring layer 76 in another implementation. The metallic mirror 78 and the metal wiring layers 76 and 79 are covered with a passivation material as similar to the infrared detector illustrated in FIG. 8. In the infrared detector illustrated in FIG. 11, the lower and upper carrier injected regions 22 and 72 are respectively grounded so as to extract the electric charges in the photoelectric converting region 24, however it is possible to form a structure with an upper carrier injected region 72 electrically connected to the lower carrier injected region 22.

Additionally, the infrared detector illustrated in FIG. 11 may be formed on a semiconductor substrate different in material from the substrate 21, and each of those infrared detectors is used to form a solid state image sensor. Moreover, those structures illustrated in FIGS. 8, 9 and 11 are of the back illuminated type, however if the anti-reflection film 23 and the metallic mirror 29 or 78 are removed from each structure, an infrared detector of the front illuminated type is realized. In this front illuminated type infrared detector, the insulating film 28 or 77 and the passivation film 33 serve as an antireflection layer.

Although particular embodiment of the present invention have been shown and described, it will be obvious to those skilled in the art that various changes and modifications may be made without departing from the spirit and scope of the present invention.

What is claimed is:

1. An optoelectric transducer operative to produce electric charges in the presence of incident light, comprising:
  (a) a carrier injected region with a first conductivity type formed of a nondegeneratively doped semiconductor material;
  (b) a potential-barrier region contiguous to said carrier injected region for producing a first homojunction and formed of a material selected from the group consisting of as first semiconductor material of said first conductivity type lower in impurity atom concentration than said carrier injected region, an intrinsic semiconductor material and a second semiconductor material of a second conductivity type opposite to said first conductivity type;
  (c) a photoelectric converting region with said first conductivity type formed of a degeneratively doped semiconductor material and operative to produce hot majority carriers and hot minority carriers upon an illumination of said incident light, said hot majority carriers being injected into said carrier injected region, a second homojunction being formed between said potential-barrier region and said photoelectric converting region, said second semiconductor material having a thickness and an impurity atom concentration selected in such a manner as to be perfectly depleted due to depletion layers extending from said first and second homojunctions in at least an electric charge producing operation; and
  (d) short-circuit means electrically interconnecting said photoelectric converting region and said potential-barrier region, in which a cut-off wavelength of said incident light is decided by a barrier height at said second homojunction, wherein said short-circuit means provides a potential barrier lower than that between said potential-barrier region and said photoelectric converting region with respect to minority carriers produced in the photoelectric converting region.

2. An optoelectric transducer as set forth in claim 1, in which said carrier injected region is formed of a p-type silicon material doped with p-type impurity atoms to have an impurity atom concentration of about $1 \times 10^{15}$ cm$^{-3}$.

3. An optoelectric transducer as set forth in claim 2, in which said potential-barrier region is formed of an n-type silicon material doped with n-type impurity atoms to have a peak impurity atom concentration ranging between $3 \times 10^{16}$ cm$^{-3}$ and $5 \times 10^{16}$ cm$^{-3}$, said n-type impurity atoms being distributed to have a profile tracing a half of a Gaussian distribution curve, wherein said potential-barrier region has a thickness ranging between 200 nano-meters and 300 nano-meters.

4. An optoelectric transducer as set forth in claim 3, in which said photoelectric converting region is formed of a p-type semiconductor material doped with p-type impurity atoms distributed to have a stepped profile with impurity atom concentrations from about $10^{18}$ cm$^{-3}$ to the uppermost solid solubility.

5. An optoelectric transducer as set forth in claim 1, in which said optoelectric transducer further comprises an insulating layer formed on said photoelectric converting region and a mirror formed on said insulating layer, wherein said carrier injected region, said potential-barrier region, said photoelectric converting region, said insulating layer and said mirror forming in combination an optical cavity for an optical resonance.

6. An optoelectric transducer as set forth in claim 5, in which said insulating layer is formed of silicon oxide having a thickness of about 1 micron.

7. An optoelectric transducer as set forth in claim 6, in which said photoelectric converting region has a p-type impurity atom concentration of about $10^{20}$ cm$^{-3}$ and a thickness ranging between 400 nano-meters and 500 nano-meters, wherein said insulating layer has a thickness ranging between 1.5 micron and 2.0 microns.

8. An optoelectric transducer as set forth in claim 5, in which said mirror is formed of aluminum.

9. An optoelectric transducer as set forth in claim 1, in which said optoelectric transducer further comprises an anti-reflection film formed on the surface of said carrier injected region.

10. An optoelectric transducer as set forth in claim 1, in which said potential barrier-region and said photoelectric conversion region are surrounded by a guard ring region of said second conductivity type forming a part of said short-circuit means.

11. An optoelectric transducer as set forth in claim 10, in which said guard ring region has a heavily doped portion larger in impurity atom concentration than the other portion of the guard ring region.

12. An optoelectric transducer as set forth in claim 11, in which said heavily doped portion is contacted to a metal wiring layer operative to extract said electric charges, wherein said carrier injected region is coupled to a constant voltage source.

13. An optoelectric transducer as set forth in claim 1, in which a short circuit is provided for electrical coupling between said photoelectric converting region and said potential-barrier region.

14. An optoelectric transducer as set forth in claim 1, in which a multiple film structure having an upper potential-barrier region and an upper carrier injected region of said first conductivity type is provided between said photoelectric converting region and said insulating film.

15. An optoelectric transducer as set forth in claim 1, in which said optoelectric transducer services as a pixel incorporated in an image sensor.

16. An optoelectric transducer as set forth in claim 1, in which said carrier injected region is formed of an n-type silicon material.

17. An optoelectric transducer as set forth in claim 16, in which said photoelectric converting region is formed of an n-type degeneratively doped silicon material.

18. An optoelectric transducer as set forth in claim 17, in which said optoelectric transducer further comprises an insulating layer of silicon dioxide formed on said photoelectric converting region and a mirror formed on said insulating layer and in which said carrier injected region, said potential-barrier region, said photoelectric converting region, said insulating layer and said mirror forming in combination an optical cavity for an optical resonance, wherein said photoelectric converting region is doped with n-type impurity atoms of about $10^{20}$ cm$^{-3}$ and has a thickness ranging between 400 nano-meters and 500 nanometers and said insulating layer has a thickness of about 1 micron.

* * * * *

UNITED STATES PATENT AND TRADEMARK OFFICE
CERTIFICATE OF CORRECTION

PATENT NO. : 4,875,084
DATED     : October 17, 1989
INVENTOR(S) : SHIGERU TOHYAMA It is certified that error appears in the above-identified patent and that said Letters Patent is hereby corrected as shown below:

On the title page:

In the Priority delete "52-73240" and insert --62-73240--;

Column 11, line 48, delete "2" and insert --25--;

Column 13, line 18, delete "he" and insert --the--;

Column 19, line 58, delete "form" and insert --from--.

Signed and Sealed this

Twenty-ninth Day of January, 1991

Attest:

HARRY F. MANBECK, JR.

*Attesting Officer*   *Commissioner of Patents and Trademarks*